United States Patent
Bock

(10) Patent No.: US 10,345,368 B2
(45) Date of Patent: Jul. 9, 2019

(54) CIRCUIT ARRANGEMENT FOR HIGH-VOLTAGE TESTS AND HIGH-VOLTAGE TESTING SYSTEM

(71) Applicant: SIEMENS AKTIENGESESCHAFT, Munich (DE)

(72) Inventor: Markus Bock, Bamberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 15/545,476

(22) PCT Filed: Jan. 7, 2016

(86) PCT No.: PCT/EP2016/050155
§ 371 (c)(1),
(2) Date: Jul. 21, 2017

(87) PCT Pub. No.: WO2016/116293
PCT Pub. Date: Jul. 28, 2016

(65) Prior Publication Data
US 2018/0011137 A1    Jan. 11, 2018

(30) Foreign Application Priority Data
Jan. 21, 2015   (DE) .................. 10 2015 200 902

(51) Int. Cl.
*G01R 31/02* (2006.01)
*G01R 31/14* (2006.01)
*G01R 31/40* (2014.01)
*G01R 1/04* (2006.01)
*G01R 31/327* (2006.01)
(Continued)

(52) U.S. Cl.
CPC .............. *G01R 31/14* (2013.01); *G01R 1/04* (2013.01); *G01R 31/027* (2013.01); *G01R 31/40* (2013.01);
(Continued)

(58) Field of Classification Search
CPC ........ G01R 31/14; G01R 1/04; G01R 31/027; G01R 31/3272; G01R 31/40
(Continued)

(56) References Cited

U.S. PATENT DOCUMENTS

| 5,396,172 | A |   | 3/1995 | Lat et al. |
| 5,786,641 | A | * | 7/1998 | Nakanishi ............. G01R 31/40 307/131 |
| 7,869,214 | B2 |   | 1/2011 | Blank et al. |

(Continued)

FOREIGN PATENT DOCUMENTS

| CN | 1417590 A | 5/2003 |
| CN | 101881813 A | 11/2010 |

(Continued)

OTHER PUBLICATIONS

Highvolt Prueftechnik Dresden GMBH; "On-site Transformer Test Systems for Induced Voltage Testing no-load / load losses Testing (Doc.No. 8.71/1)"; Internet Citation; Oct. 17, 2008; XP007906010.
(Continued)

*Primary Examiner* — Reena Aurora
(74) *Attorney, Agent, or Firm* — Laurence Greenberg; Werner Stemer; Ralph Locher

(57) ABSTRACT

A circuit configuration for high-voltage tests includes an AC voltage source and at least two circuit branches, each of which can be electrically connected to the AC voltage source. An electrical AC voltage can be applied to a test object by a first circuit branch, and an electrical DC voltage can be applied to the test object by a second circuit branch which rectifies an AC voltage.

16 Claims, 1 Drawing Sheet

(51) Int. Cl.
*H02M 1/10* (2006.01)
*H02M 7/06* (2006.01)

(52) U.S. Cl.
CPC .......... *G01R 31/3272* (2013.01); *H02M 1/10* (2013.01); *H02M 7/06* (2013.01)

(58) Field of Classification Search
USPC ........................................................ 324/527
See application file for complete search history.

(56) References Cited

U.S. PATENT DOCUMENTS

2013/0176046 A1 7/2013 Brown et al.
2014/0125351 A1 5/2014 Woodward, Jr. et al.

FOREIGN PATENT DOCUMENTS

| | | |
|---|---|---|
| CN | 103078483 A | 5/2013 |
| DE | 912972 B | 6/1954 |
| DE | 4233102 C2 | 3/1995 |
| DE | 202008017987 U1 | 3/2011 |
| DE | 102012215768 A1 | 3/2013 |
| EP | 2765429 A2 | 8/2014 |
| WO | 2011157046 A1 | 12/2011 |

OTHER PUBLICATIONS

Schleich—Advanced Test Technologies; "The MTC3-Class—MTC3 Stator Testers"; Jun. 1, 2013; XP055267466.

* cited by examiner

CIRCUIT ARRANGEMENT FOR HIGH-VOLTAGE TESTS AND HIGH-VOLTAGE TESTING SYSTEM

BACKGROUND OF THE INVENTION

Field of the Invention

The invention relates to a circuit arrangement for high-voltage tests and to a high-voltage testing system.

The complete high-voltage testing of high-voltage products requires, inter alia, AC voltage and/or DC voltage and impulse voltage tests. AC voltage tests are used most frequently as routine and/or type testing for AC voltage products. However, DC voltage tests will also be increasingly required as routine and/or type testing for the growing market of DC voltage products.

Impulse voltage tests are additionally needed to test both product categories, that is to say DC voltage products and AC voltage products. In this case, two types of impulse voltage tests are required: so-called switching impulse and lightning impulse tests. A switching impulse test is generally sufficient as a special test or type test from a technical point of view and is usually also practiced as such. The number of switching impulse tests to be executed is therefore relatively low in practice. In contrast, lightning impulse tests are useful not only as special or type tests from a technical point of view but also as routine tests, in particular in the case of gas-insulated products. Although lightning impulse routine tests are currently carried out relatively rarely on account of the additionally required effort, the demand for lightning impulse routine tests is continuously increasing.

AC voltage, DC voltage and impulse voltage tests are usually carried out separately from one another in three separate testing systems. This gives rise to a relatively large need for space and investment for a plurality of testing systems in the test field and a corresponding amount of effort to transport a test object between the different testing systems. In the case of on-site tests, effort additionally arises for shipping a plurality of systems. The effort is particularly great when testing gas-insulated products, for example gas-insulated switchgear. Such products are preferably flanged directly (without an air feed-through) to a testing system in order to reduce the space required for large insulating clearances in air and to achieve good partial discharge interference levels. For AC voltage tests, this is possible using available testing systems. In contrast, for lightning impulse and DC voltage tests, this generally requires alteration of testing systems with test air feed-throughs.

SUMMARY OF THE INVENTION

The invention is based on the object of specifying an improved circuit arrangement for high-voltage tests.

The object is achieved, according to the invention, by means of the features described below.

The subclaims relate to advantageous configurations of the invention.

A circuit arrangement according to the invention for high-voltage tests comprises an AC voltage source and at least two circuit branches which can each be electrically connected to the AC voltage source. In this case, an electrical AC voltage can be applied to a test object by means of a first circuit branch, and an electrical DC voltage can be applied to the test object by means of a second circuit branch which rectifies an AC voltage.

Such a circuit arrangement advantageously makes it possible to implement a high-voltage testing system which can be used to selectively carry out AC and/or DC voltage tests on a test object without having to change the position of the test object. In addition, impulse voltage tests can also be implemented by suitably forming the second circuit branch (see below), with the result that all three high-voltage test types (AC, DC and impulse voltage tests) can be carried out in a space-saving and cost-effective manner in a single high-voltage testing system.

Configurations of the invention provide a first switch which can be used to electrically connect the first circuit branch to the AC voltage source, and/or a second switch which can be used to electrically connect the second circuit branch to the AC voltage source.

Such switches advantageously make it possible to selectively apply a DC voltage and/or an AC voltage to a test object in a particularly simple manner.

Another configuration of the invention provides for the AC voltage source to have a controllable transformer for producing AC voltages of variable root mean square values.

As a result, the AC voltages which can be applied to the test object by means of the first circuit branch and the DC voltages which can be applied to the test object by means of the second circuit branch can be advantageously adapted to the test object and to the test requirements. In particular, the invention provides AC voltage sources which can be used to produce AC voltages of relatively high root mean square values of up to 750 kV, for example. As a result, no or relatively moderate means for producing sufficiently high AC and DC voltages and impulse voltages produced from the DC voltages are required for conventional high-voltage tests in the two circuit branches, with the result that costs and effort for multiplying voltage in the circuit branches are dispensed with, in particular.

Another configuration of the invention provides at least one impulse voltage generator stage for producing a high-voltage pulse which can be applied to a test object, the impulse voltage generator stage having a storage capacitor and a spark gap for discharging the storage capacitor.

This configuration of the invention advantageously makes it possible to produce high-voltage pulses by charging at least one storage capacitor and discharging it via at least one spark gap.

In this case, the circuit arrangement preferably has at least two impulse voltage generator stages connected in series.

This advantageously makes it possible to increase the voltages of the high-voltage pulses by coupling a plurality of impulse voltage generator stages.

In this case, a first impulse voltage generator stage preferably has an actively triggerable first spark gap.

This advantageously makes it possible to produce high-voltage pulses in a safe and temporally controllable manner by actively triggering the spark gap of an impulse voltage generator stage.

A circuit arrangement designed with at least one impulse voltage generator stage also preferably comprises a chopping gap connected in parallel with the test object. In this case, the chopping gap is preferably actively triggerable.

This advantageously makes it possible to produce a special form of lightning impulse voltages with chopped voltage waves.

A particularly preferred configuration of the invention provides for the at least one impulse voltage generator stage to be integrated in the second circuit branch.

This configuration advantageously makes it possible to implement a high-voltage testing system in a particularly efficient and space-saving manner, which testing system can be used to selectively implement AC, DC and/or impulse voltage tests by also using the DC voltage of the second circuit branch to produce impulse voltages.

Further configurations of a circuit arrangement having at least one impulse voltage generator stage provide for at least one impulse voltage generator stage to have a spark gap having spark gap electrodes, the electrode spacing of which can be adjusted until the spark gap electrodes touch, and/or for the spark gap of at least one impulse voltage generator stage to be able to be bridged by means of a bypass line and a bypass switch.

These configurations advantageously make it possible to short-circuit spark gaps if necessary, for example in order to implement a pure DC voltage test without impulse voltages by means of the second circuit branch and/or in order to discharge the capacitor after the end of operation for reasons of safety.

Another configuration of the invention provides for the first circuit branch to comprise, for partial discharge measurements, a coupling capacitor and a first decoupling four-terminal network connected downstream of the latter.

This configuration of the invention advantageously makes it possible to also carry out AC partial discharge measurements by means of the first circuit branch.

Another configuration of the invention provides for the second circuit branch to comprise a Villard circuit element having a Villard charging capacitor and a Villard diode for increasing the DC voltage.

This configuration of the invention advantageously makes it possible to increase the DC voltage in the second circuit branch by means of a so-called Villard circuit.

In this case, the second circuit branch preferably has, for partial discharge measurements, a second decoupling four-terminal network which can be connected to the Villard charging capacitor via a decoupling switch.

This development of the above-mentioned configuration of the invention advantageously makes it possible to carry out a partial discharge measurement during DC voltage operation by means of the second circuit branch.

A high-voltage testing system according to the invention has a circuit arrangement according to the invention for high-voltage tests with the advantages already mentioned above.

In this case, the circuit arrangement is preferably arranged in a housing which is designed to be filled with an insulation gas and has a connecting flange for a test object.

This advantageously enables the high-voltage testing of gas-insulated products, for example gas-insulated switchgear, for AC, DC and/or impulse voltage tests at the connecting flange without having to newly mount a test object.

BRIEF DESCRIPTION OF THE SEVERAL VIEWS OF THE DRAWING

The above-described properties, features and advantages of this invention and the manner in which they are achieved become clearer and more clearly comprehensible in connection with the following description of exemplary embodiments which are explained in more detail in connection with the drawings, in which.

DESCRIPTION OF THE INVENTION

Figure 1:
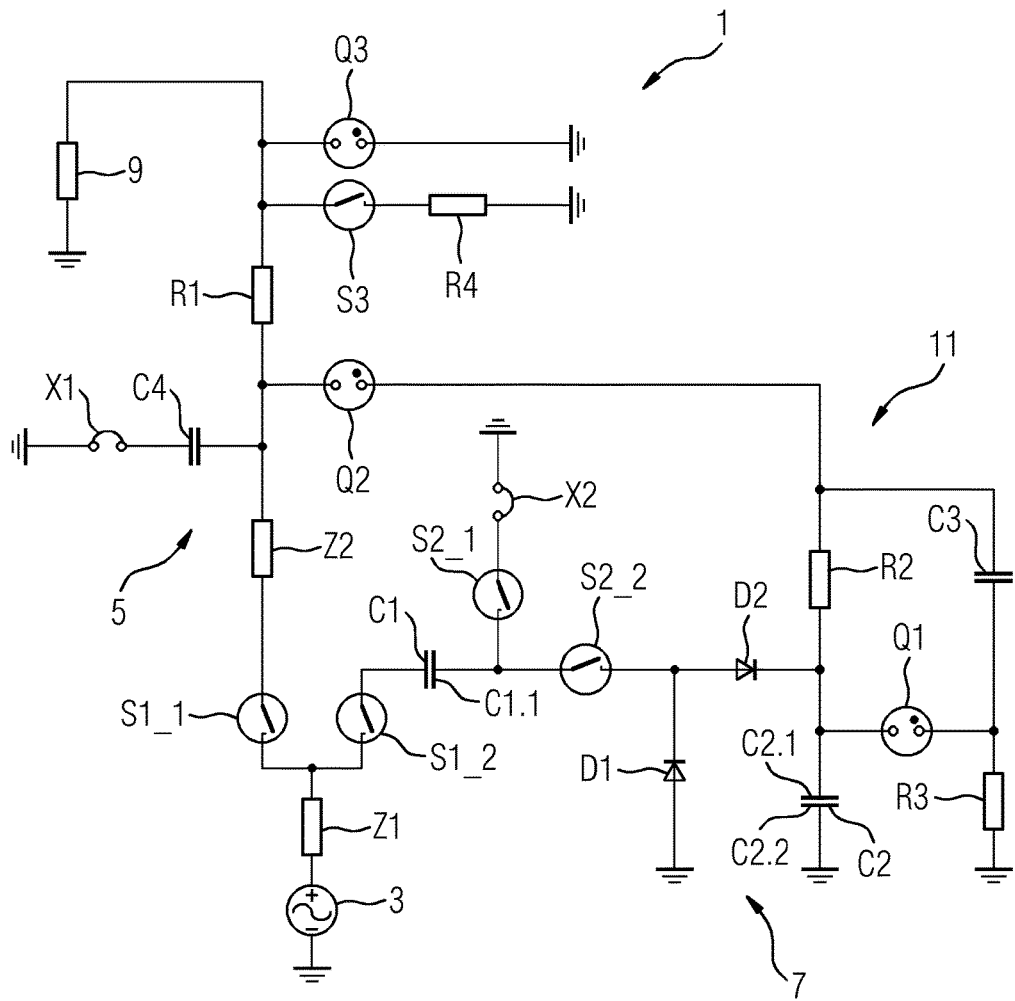
FIG. 1 shows a circuit diagram of a circuit arrangement for high-voltage tests, and FIG. 2 schematically shows a high-voltage testing system for high-voltage tests.

FIG. 1 shows a circuit diagram of a circuit arrangement 1 of a high-voltage testing system 13 for high-voltage tests which is not illustrated in FIG. 1, various components of the illustrated circuit arrangement 1 being optional, as stated below.

The circuit arrangement 1 comprises an AC voltage source 3, a first circuit branch 5 which can be electrically connected to the AC voltage source 3 via a first switch S1_1, and a second circuit branch 7 which can be electrically connected to the AC voltage source 3 via a second switch S1_2. The switches S1_1, S1_2 can also be implemented together as a changeover switch.

The AC voltage source 3 preferably comprises a controllable transformer for producing comparatively high AC voltages, for example AC voltages having root mean square values of up to 750 kV.

An electrical AC voltage can be applied to a test object 9 by means of the first circuit branch 5.

The first circuit branch 5 optionally comprises, for AC partial discharge measurements, a coupling capacitor C4 and a first decoupling four-terminal network X1 connected downstream of the latter.

An electrical DC voltage can be applied to the test object 9 by means of the second circuit branch 7. For this purpose, the second circuit branch 7 comprises a half-wave rectifier stage which consists of a rectifier diode D2 and a first storage capacitor C2. The rectifier diode D2 is connected between the second switch S1_2 and the test object 9. A first electrode C2.1 of the first storage capacitor C2 is connected to the test-object-side pole of the rectifier diode D2, and the second electrode C2.2 is connected to a signal ground.

The second circuit branch 7 optionally also comprises a Villard circuit element having a Villard charging capacitor C1 and a Villard diode D1 for increasing the DC voltage. In this case, the Villard charging capacitor C1 is connected between the second switch S1_2 and the rectifier diode D2. The Villard diode D1 is connected between the signal ground and a first electrode C1.1 of the Villard charging capacitor C1 which is connected to the rectifier diode D2, with the result that the Villard charging capacitor C1, the Villard diode D1, the rectifier diode D2 and the first storage capacitor C2 form a Greinacher circuit for increasing the voltage.

In the embodiment with the Villard charging capacitor C1 and the Villard diode D1, the second circuit branch 7 also optionally comprises an interrupter switch S2_2 which can be used to interrupt an electrical connection of the Villard charging capacitor C1 to the Villard diode D1 and the rectifier diode D2 in order to increase the operational safety, and/or, for partial discharge measurements, a second decoupling four-terminal network X2 which can be connected to the first electrode C1.1 of the Villard charging capacitor C1 via a decoupling switch S2_1, with the result that a partial discharge measurement can also be carried out during DC voltage operation. Partial discharge calibration signals can be fed in in a known manner via a sliding bar. A grounding slide (not illustrated here) for the Villard charging capacitor C1 may also be optionally provided downstream of the second switch S1_2.

In order to reverse the polarity of the DC voltage in the second circuit branch 7, known diode designs can be implemented, for example a segmented structure and a mechanical balancing circuit or rotation circuit of the segments. In the implementation with the Villard charging capacitor C1 and the Villard diode D1, the two diodes D1, D2 are preferably arranged in a geometrically linear manner with respect to one another in order to be able to easily couple the polarity reversal mechanisms of both diodes D1, D2.

A particularly preferred exemplary embodiment provides for an impulse generator circuit 11 having a plurality of impulse voltage generator stages, which are connected in series and are intended to produce a high-voltage pulse which can be applied to the test object 9 according to the principle of a so-called Marx generator, to be integrated in the second circuit branch 7. In the exemplary embodiment illustrated, the impulse generator circuit 11 comprises two impulse voltage generator stages which are connected in series and are formed by two spark gaps Q1, Q2, the first storage capacitor C2, a second storage capacitor C3 and two discharge resistors R2, R3.

In this case, a first impulse voltage generator stage comprises an actively triggerable first spark gap Q1 for discharging the first storage capacitor C2. The second impulse voltage generator stage comprises the second spark gap Q2 for discharging the second storage capacitor C3. The two storage capacitors C2, C3 are connected in series via the first spark gap Q1. The second spark gap Q2 is connected between the second storage capacitor C3 and the test object 9, with the result that discharging of the first storage capacitor C2 via the first spark gap Q1 increases the voltage applied to the second storage capacitor C3, as a result of which the second spark gap Q2 is triggered and a high-voltage pulse is transmitted to the test object 9.

A third discharge resistor R4 which is connected between the test object 9 and the signal ground may be optionally provided and can be connected to an additional switch S3 which is connected upstream or downstream of it. The third discharge resistor R4 may be dispensed with if the first discharge resistor R2 and the second discharge resistor R3 suffice for discharging in the case of triggered spark gaps Q1, Q2.

A chopping gap Q3 which is connected between the test object 9 and the signal ground and is intended to produce a special form of a lightning impulse voltage with a chopped voltage wave may also be optionally provided. The chopping gap Q3 is preferably actively triggerable.

In order to carry out DC voltage tests without a high-voltage pulse produced by means of the impulse generator circuit 11, the second spark gap Q2 can be bridged by means of a bypass line and a bypass switch, which are not illustrated here, or an electrode spacing of the spark gap electrodes of the second spark gap Q2 can be adjusted until the spark gap electrodes touch.

For reasons of safety and in order to discharge the capacitor after the end of operation and/or in order to avoid the triggering of the first spark gap Q1 in the case of a pure DC voltage test without a high-voltage pulse, an electrode spacing of the spark gap electrodes of the first spark gap Q1 can optionally also be adjusted until the spark gap electrodes touch.

Both circuit branches 5, 7 are connected to the test object 9 via a series resistor R1. The series resistor R1 is used as a protective resistor in order to avoid damage to the high-voltage testing system 13, in particular as a result of voltage spikes, and, in the case of an implementation with an impulse generator circuit 11, is used as an additional charging resistor for the impulse generator circuit 11. For greater protective designs, a first impedance Z1 connected between the AC voltage source 3 and the switches S1_1, S1_2 and/or a second impedance Z2 connected in the first circuit branch 5 between the first switch S1_1 and the test object 9 may be optionally provided.

For a pure AC voltage test of the test object 9, the first switch S1_1 is closed and the second switch S1_2 is opened.

For a DC voltage test of the test object 9, the first switch S1_1 is opened and the second switch S1_2 is closed. If the DC voltage test is intended to be carried out, in the case of an implementation with an impulse generator circuit 11, without a high-voltage pulse produced by the impulse generator circuit 11, the triggering of the first spark gap Q1 is also reliably avoided by suitably setting parameters of the first spark gap Q1, for example a pressure and/or an electrode spacing, and the second spark gap Q2 is either bridged or the spark gap electrodes of the second spark gap Q2 are brought into contact with one another.

For an impulse voltage test of the test object 9, the first switch S1_1 is opened and the second switch S1_2 is closed, and a high-voltage pulse is produced by actively triggering the first spark gap Q1.

For an AC voltage test with an impulse voltage test of the test object 9, which is superimposed on the AC voltage test, both switches S1_1, S1_2 are closed, and a high-voltage pulse is produced by actively triggering the first spark gap Q1.

Figure 2:
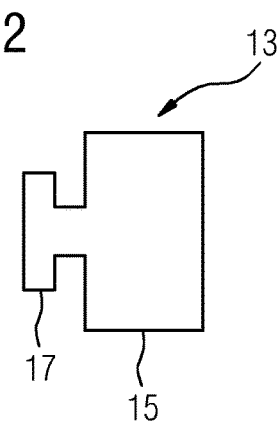

FIG. 2 shows, in a purely schematic manner, a high-voltage testing system 13 having a circuit arrangement 1 for high-voltage tests which is not visible in FIG. 2. The circuit arrangement 1 is arranged in a housing 15 which is designed to be filled with an insulation gas, for example with sulfur hexafluoride, and has a connecting flange 17 for a test object 9.

Although the invention has been described and illustrated more specifically in detail by means of preferred exemplary embodiments, the invention is not restricted by the disclosed examples and other variations can be derived therefrom by a person skilled in the art without departing from the scope of protection of the invention.

The invention claimed is:

1. A circuit configuration for high-voltage tests, the circuit configuration comprising:
    an AC voltage source having a controllable transformer for producing AC voltages having different root mean square values;
    at least first and second circuit branches each configured to be electrically connected to said AC voltage source;
    said first circuit branch being configured to apply an electrical AC voltage to a test object; and
    said second circuit branch rectifying an AC voltage and being configured to apply an electrical DC voltage to the test object.

2. The circuit configuration according to claim 1, which further comprises at least one of a first switch for electrically connecting said first circuit branch to said AC voltage source or a second switch for electrically connecting said second circuit branch to said AC voltage source.

3. A high-voltage testing system, comprising a circuit configuration according to claim 1 for high-voltage tests.

4. The high-voltage testing system according to claim 3, which further comprises a housing constructed to be filled with an insulation gas, said housing having a connecting flange for a test object, and said circuit configuration being disposed in said housing.

5. A circuit configuration for high-voltage tests, the circuit configuration comprising:
    an AC voltage source;
    at least first and second circuit branches each configured to be electrically connected to said AC voltage source;
    said first circuit branch being configured to apply an electrical AC voltage to a test object;

said second circuit branch rectifying an AC voltage and being configured to apply an electrical DC voltage to the test object; and at least one impulse voltage generator stage for producing a high-voltage pulse to be applied to a test object, said at least one impulse voltage generator stage having a storage capacitor and a spark gap for discharging said storage capacitor.

6. The circuit configuration according to claim 5, wherein said at least one impulse voltage generator stage includes two impulse voltage generator stages connected in series.

7. The circuit configuration according to claim 5, wherein said at least one impulse voltage generator stage includes a first impulse voltage generator stage having an actively triggerable first spark gap.

8. The circuit configuration according to claim 5, which further comprises a chopping gap connected in parallel with the test object.

9. The circuit configuration according to claim 8, wherein said chopping gap is actively triggerable.

10. The circuit configuration according to claim 5, wherein said at least one impulse voltage generator stage is integrated in said second circuit branch.

11. The circuit configuration according to claim 5, wherein:
said spark gap of said at least one impulse voltage generator stage includes spark gap electrodes having an electrode spacing being adjustable until said spark gap electrodes touch; and
a bypass line and a bypass switch are configured to bridge said spark gap of said at least one impulse voltage generator stage.

12. The circuit configuration according to claim 5, wherein said spark gap of said at least one impulse voltage generator stage includes spark gap electrodes having an electrode spacing being adjustable until said spark gap electrodes touch.

13. The circuit configuration according to claim 5, which further comprises a bypass line and a bypass switch configured to bridge said spark gap of said at least one impulse voltage generator stage.

14. A circuit configuration for high-voltage tests, the circuit configuration comprising:
an AC voltage source;
at least first and second circuit branches each configured to be electrically connected to said AC voltage source;
said first circuit branch being configured to apply an electrical AC voltage to a test object, said first circuit branch including a coupling capacitor and a first decoupling four-terminal network connected downstream of said coupling capacitor, for partial discharge measurements; and
said second circuit branch rectifying an AC voltage and being configured to apply an electrical DC voltage to the test object.

15. A circuit configuration for high-voltage tests, the circuit configuration comprising:
an AC voltage source;
at least first and second circuit branches each configured to be electrically connected to said AC voltage source;
said first circuit branch being configured to apply an electrical AC voltage to a test object; and
said second circuit branch rectifying an AC voltage and being configured to apply an electrical DC voltage to the test object, said second circuit branch including a Villard circuit element having a Villard charging capacitor and a Villard diode for increasing the DC voltage.

16. The circuit configuration according to claim 15, wherein said second circuit branch includes a decoupling switch and a second decoupling four-terminal network to be connected to said Villard charging capacitor by said decoupling switch, for partial discharge measurements.

* * * * *